(12) United States Patent
Enyama et al.

(10) Patent No.: US 12,205,790 B2
(45) Date of Patent: *Jan. 21, 2025

(54) CHARGED PARTICLE BEAM DEVICE

(71) Applicant: Hitachi High-Tech Corporation, Tokyo (JP)

(72) Inventors: Momoyo Enyama, Tokyo (JP); Makoto Sakakibara, Tokyo (JP); Hajime Kawano, Tokyo (JP); Hiroya Ohta, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 429 days.

This patent is subject to a terminal disclaimer.

(21) Appl. No.: 17/623,363

(22) PCT Filed: Jul. 8, 2019

(86) PCT No.: PCT/JP2019/026926
§ 371 (c)(1),
(2) Date: Dec. 28, 2021

(87) PCT Pub. No.: WO2021/005671
PCT Pub. Date: Jan. 14, 2021

(65) Prior Publication Data
US 2022/0359150 A1    Nov. 10, 2022

(51) Int. Cl.
*H01J 37/147*  (2006.01)
*H01J 37/153*  (2006.01)
(Continued)

(52) U.S. Cl.
CPC ...... *H01J 37/1471* (2013.01); *H01J 37/1472* (2013.01); *H01J 37/153* (2013.01);
(Continued)

(58) Field of Classification Search
CPC .. H01J 37/1471; H01J 37/1472; H01J 37/153; H01J 37/244; H01J 37/265;
(Continued)

(56) References Cited

U.S. PATENT DOCUMENTS 11,177,108 B2 * 11/2021 Shirasaki ............... H01J 37/28
2007/0075259 A1    4/2007 Fujita
(Continued)

FOREIGN PATENT DOCUMENTS

JP    H11233062 A    8/1999
JP    2001124713 A    5/2001
(Continued)

OTHER PUBLICATIONS

Office Action mailed Apr. 30, 2021 in Taiwanese Application No. 109121072.
(Continued)

*Primary Examiner* — Nicole M Ippolito
*Assistant Examiner* — Hanway Chang
(74) *Attorney, Agent, or Firm* — Miles & Stockbridge, P.C.

(57) ABSTRACT

The invention provides a charged particle beam device capable of reducing a positional shift between secondary beams generated in a beam separator. The charged particle beam device includes a charged particle beam source configured to irradiate a sample with a plurality of primary beams, a plurality of detectors configured to detect secondary beams emitted from the sample in correspondence to the primary beams, and a beam separator configured to deflect the secondary beams in a direction different from that of the primary beams. The charged particle beam device further includes a deflector provided between the beam separator and the detector to correct a positional shift between the secondary beams generated in the beam separator.

10 Claims, 14 Drawing Sheets

(51) Int. Cl.
*H01J 37/244* (2006.01)
*H01J 37/26* (2006.01)
*H01J 37/28* (2006.01)

(52) U.S. Cl.
CPC .......... *H01J 37/244* (2013.01); *H01J 37/265* (2013.01); *H01J 37/28* (2013.01); *H01J 2237/151* (2013.01); *H01J 2237/152* (2013.01); *H01J 2237/1534* (2013.01); *H01J 2237/2448* (2013.01)

(58) Field of Classification Search
CPC ................. H01J 37/28; H01J 2237/151; H01J 2237/152; H01J 2237/1534; H01J 2237/2448
See application file for complete search history.

(56) References Cited

U.S. PATENT DOCUMENTS

| | | |
|---|---|---|
| 2009/0014649 A1 | 1/2009 | Nakasuji et al. |
| 2009/0218506 A1 | 9/2009 | Nakasuji et al. |
| 2010/0320382 A1 | 12/2010 | Almogy et al. |
| 2016/0307726 A1 | 10/2016 | Hatakeyama et al. |
| 2017/0154756 A1 | 6/2017 | Ren et al. |
| 2018/0005797 A1 | 1/2018 | Kato |
| 2019/0051487 A1 | 2/2019 | Ogasawara et al. |
| 2021/0005417 A1 | 1/2021 | Shirasaki et al. |

FOREIGN PATENT DOCUMENTS

| | | |
|---|---|---|
| JP | 2003187730 A | 7/2003 |
| JP | 2007035386 A | 2/2007 |
| JP | 2008078058 A | 4/2008 |
| JP | 2011192498 A | 9/2011 |
| JP | 2013232422 A | 11/2013 |
| JP | 2018535525 A | 11/2018 |
| JP | 2019036403 A | 3/2019 |
| TW | 201634917 A | 10/2016 |
| TW | 201942933 A | 11/2019 |
| WO | 2006101116 A1 | 9/2006 |
| WO | 2019005483 A1 | 1/2019 |

OTHER PUBLICATIONS

Search Report mailed Sep. 24, 2019 in International Application No. PCT/JP2019/026926.
Written Opinion mailed Sep. 24, 2019 in International Application No. PCT/JP2019/026926.
Search Report dated Jun. 26, 2018 in International Application No. PCT/JP2018/013901.
Written Opinion dated Jun. 26, 2018 in International Application No. PCT/JP2018/013901.

* cited by examiner

[FIG. 1]
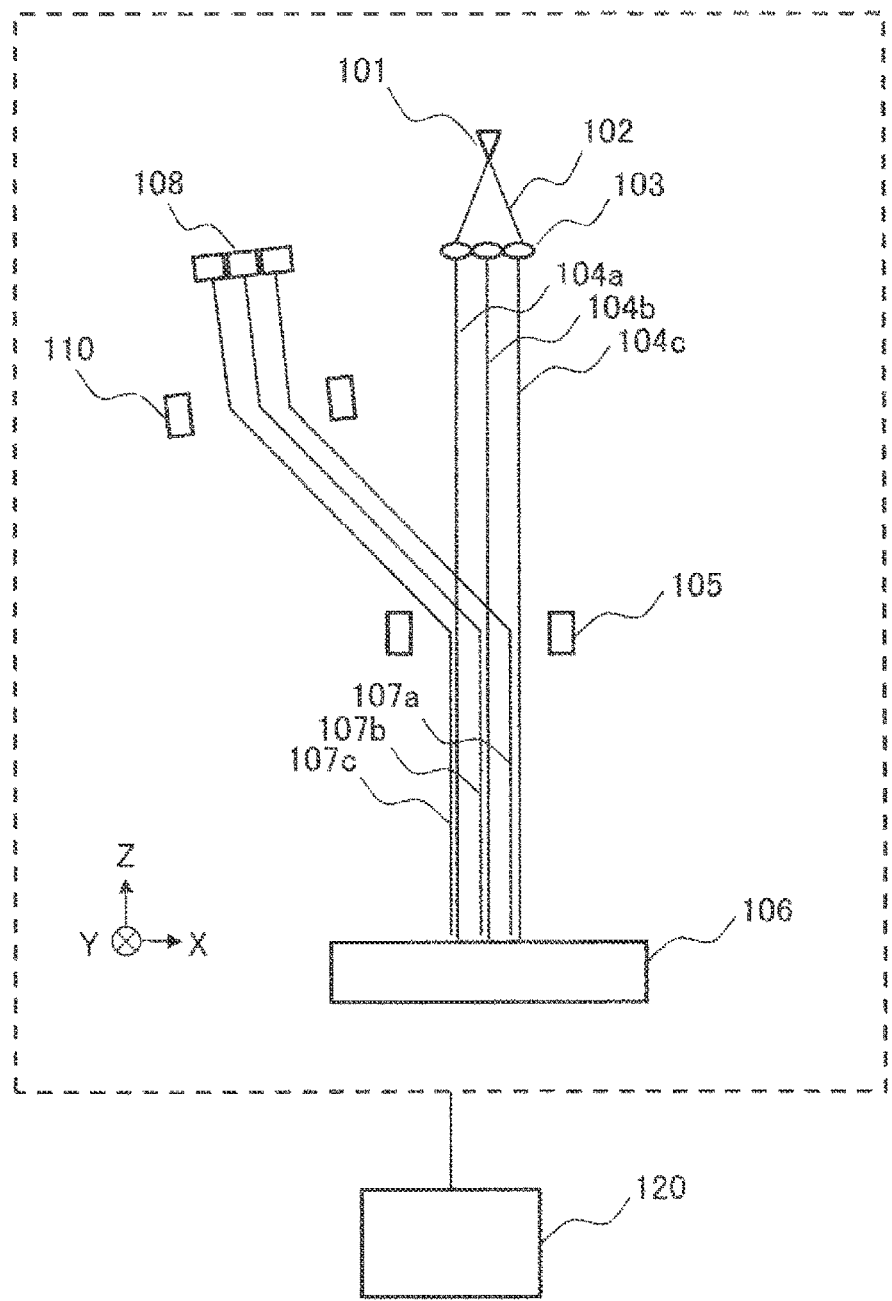

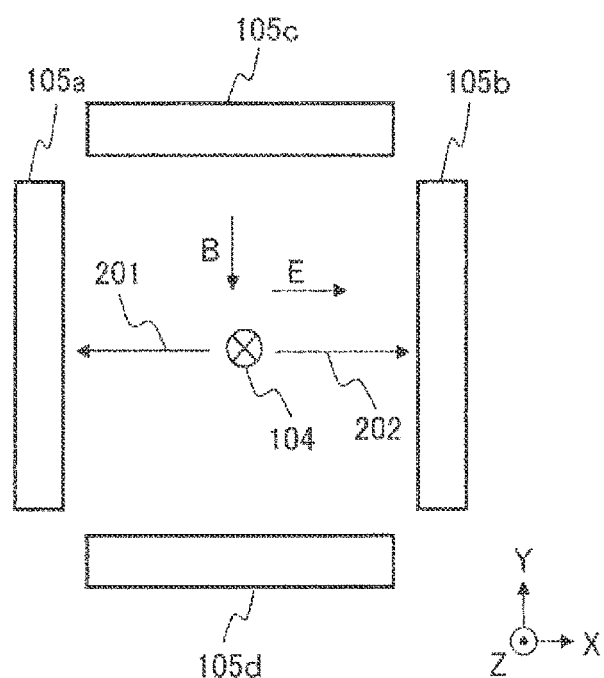
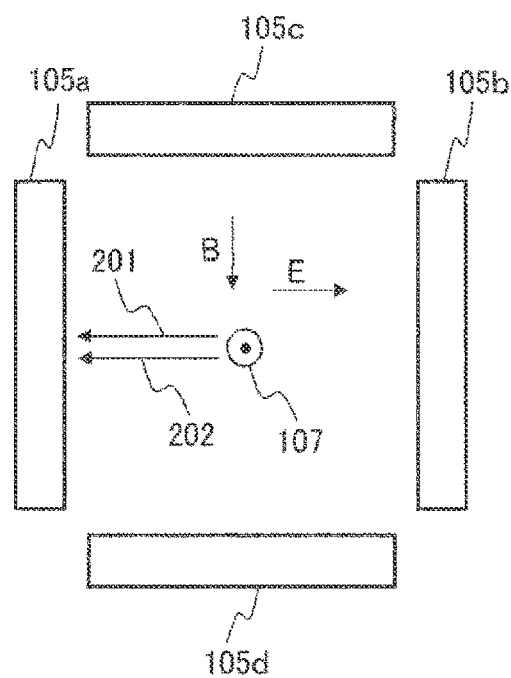

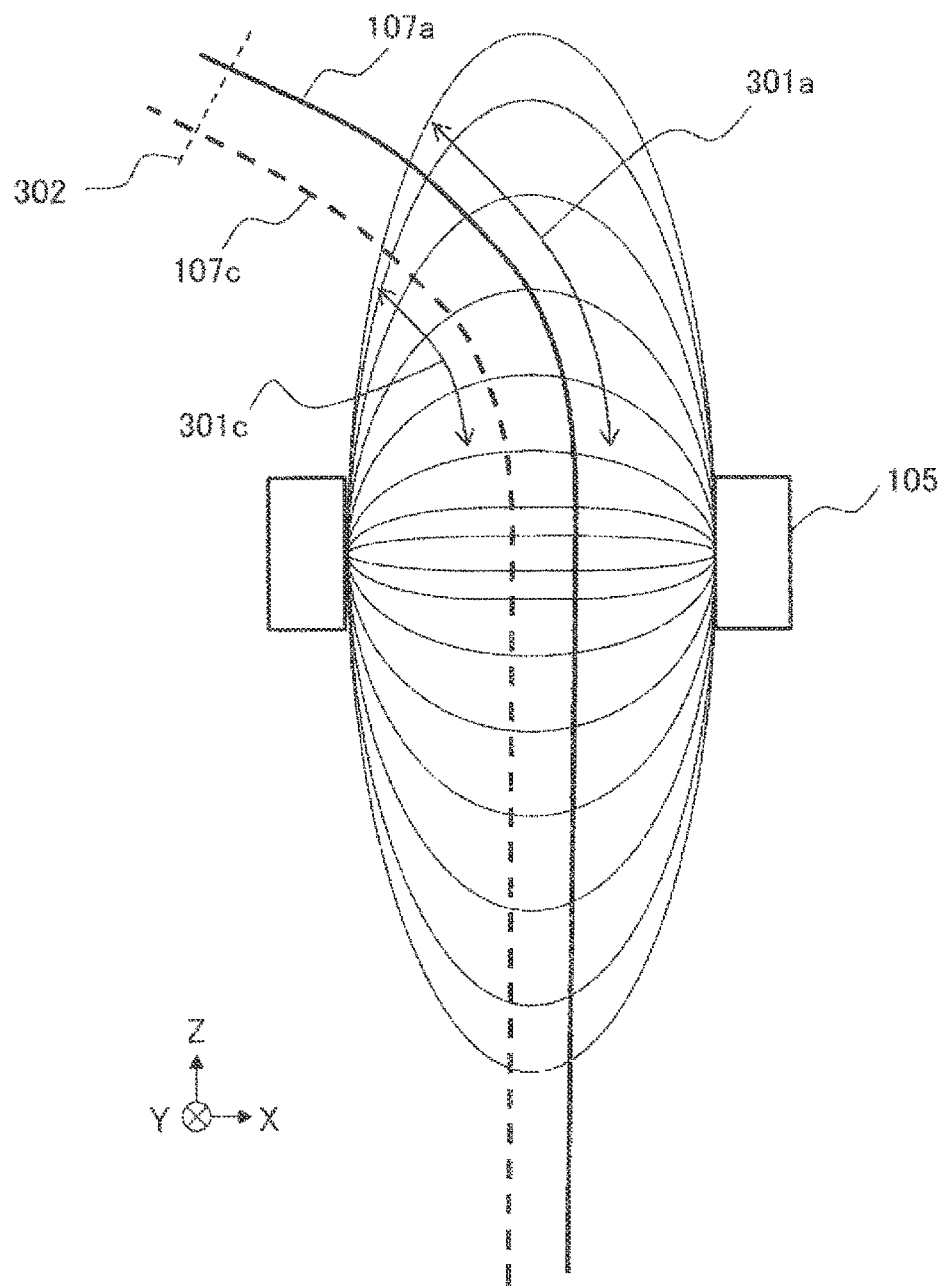
[FIG. 3]

[FIG. 4]
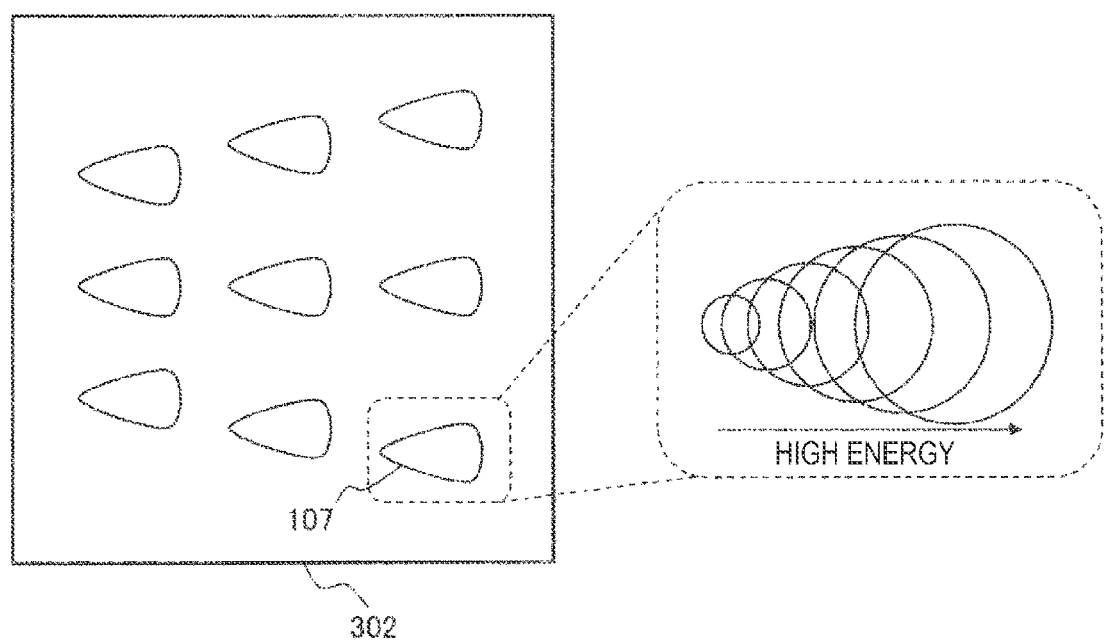

[FIG. 6]
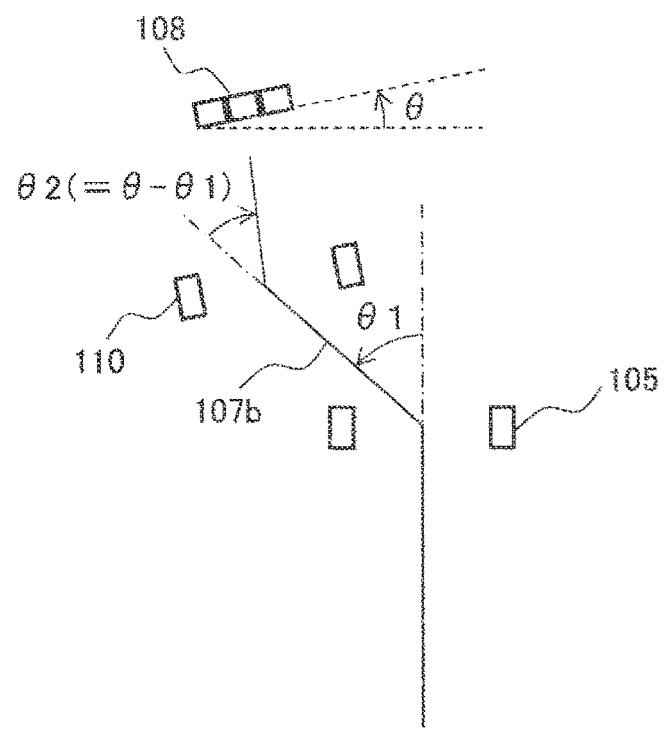

[FIG. 7]
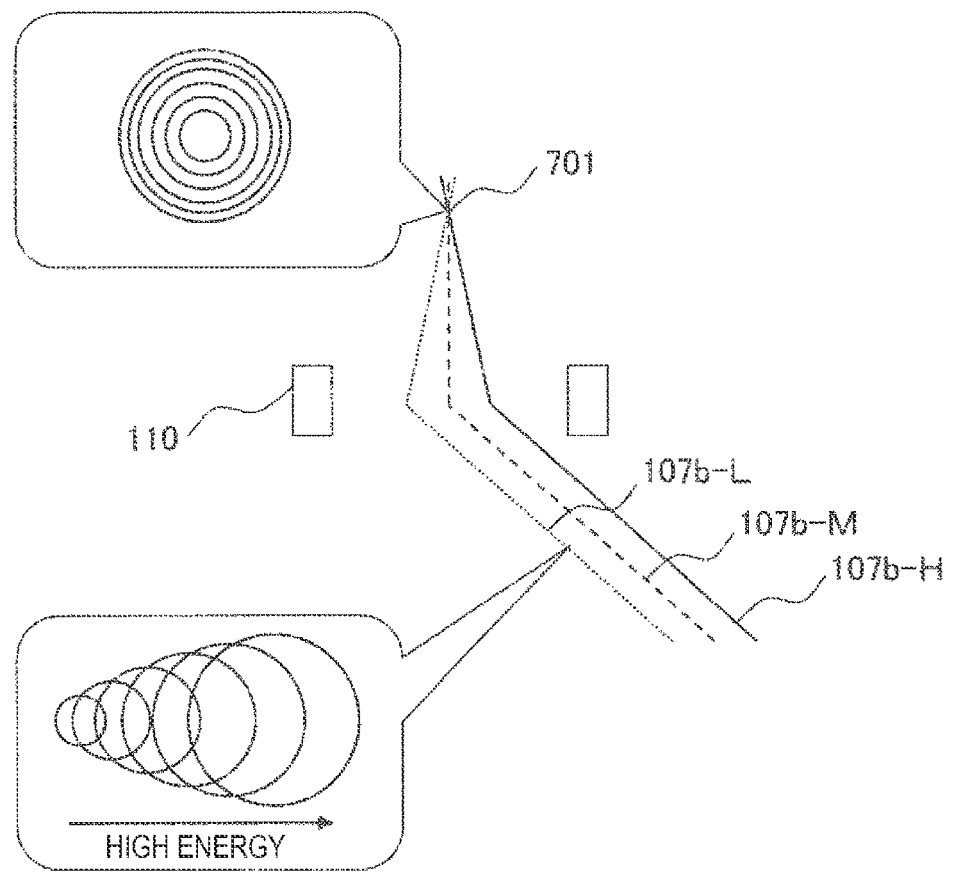

[FIG. 8]
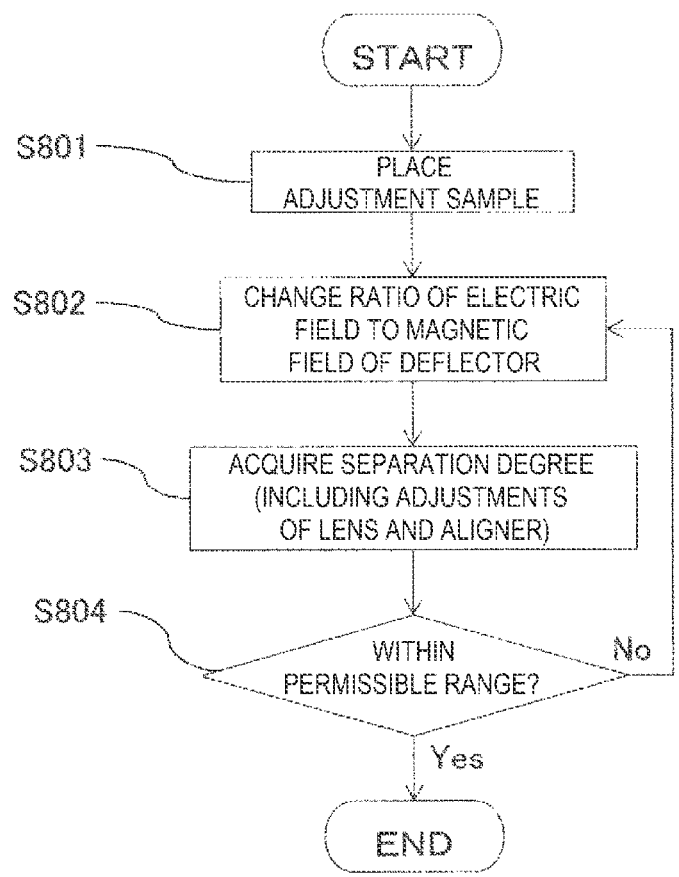

[FIG. 9]
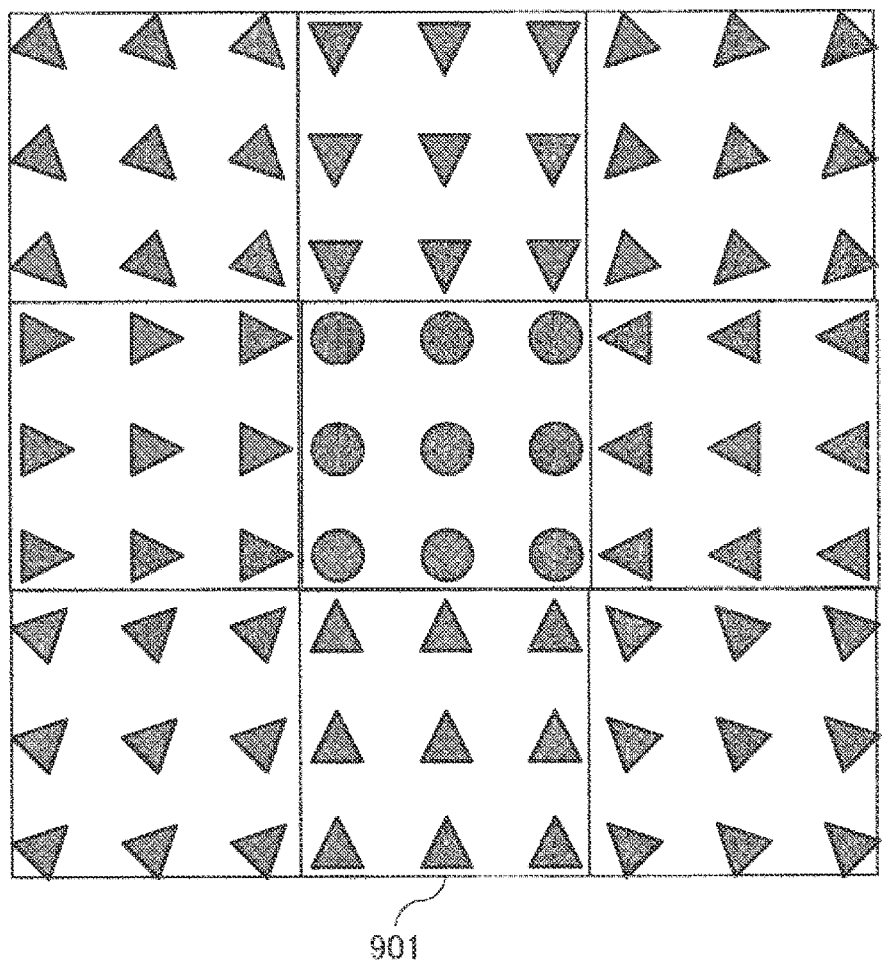
901

[FIG. 10]
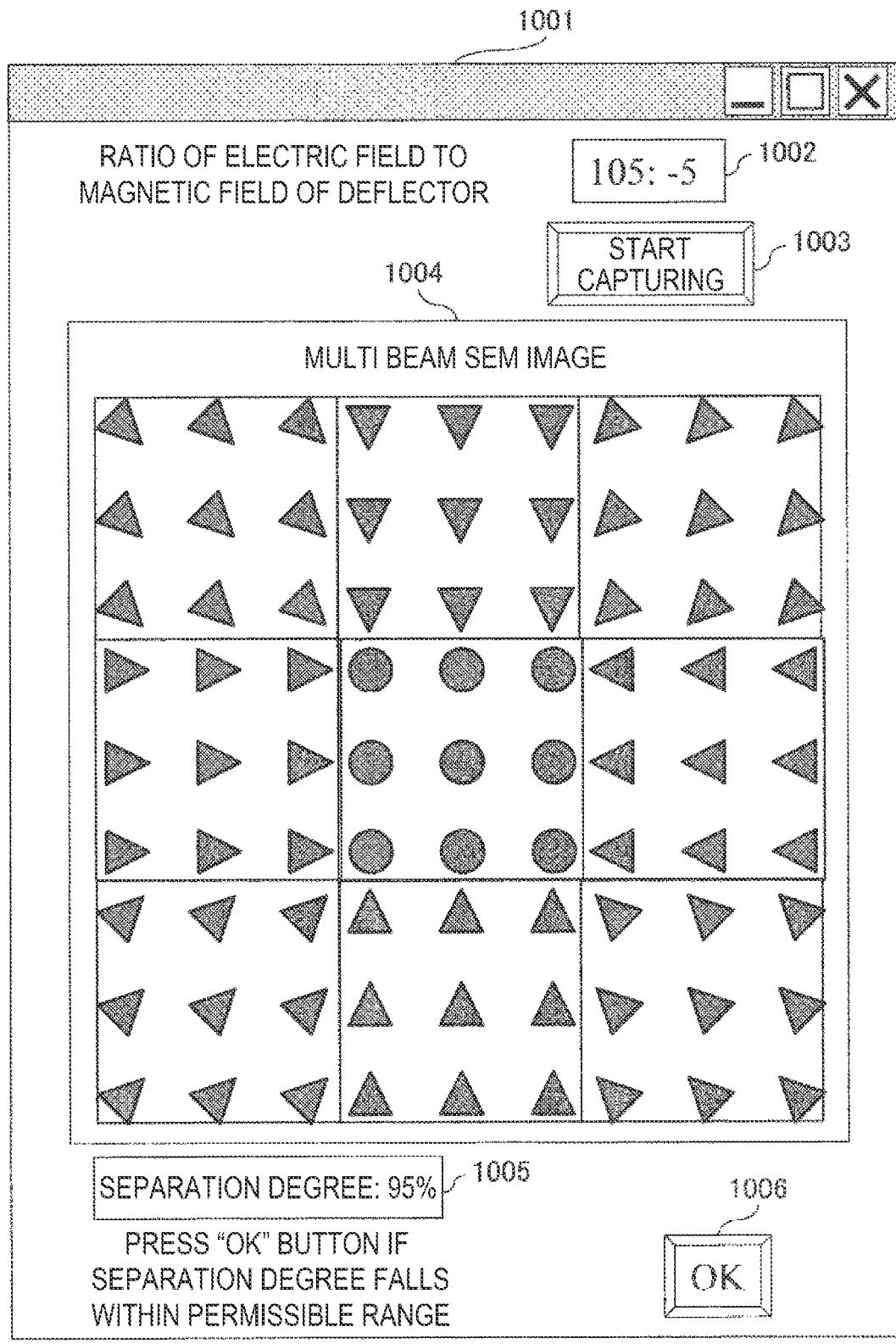

[FIG. 11]
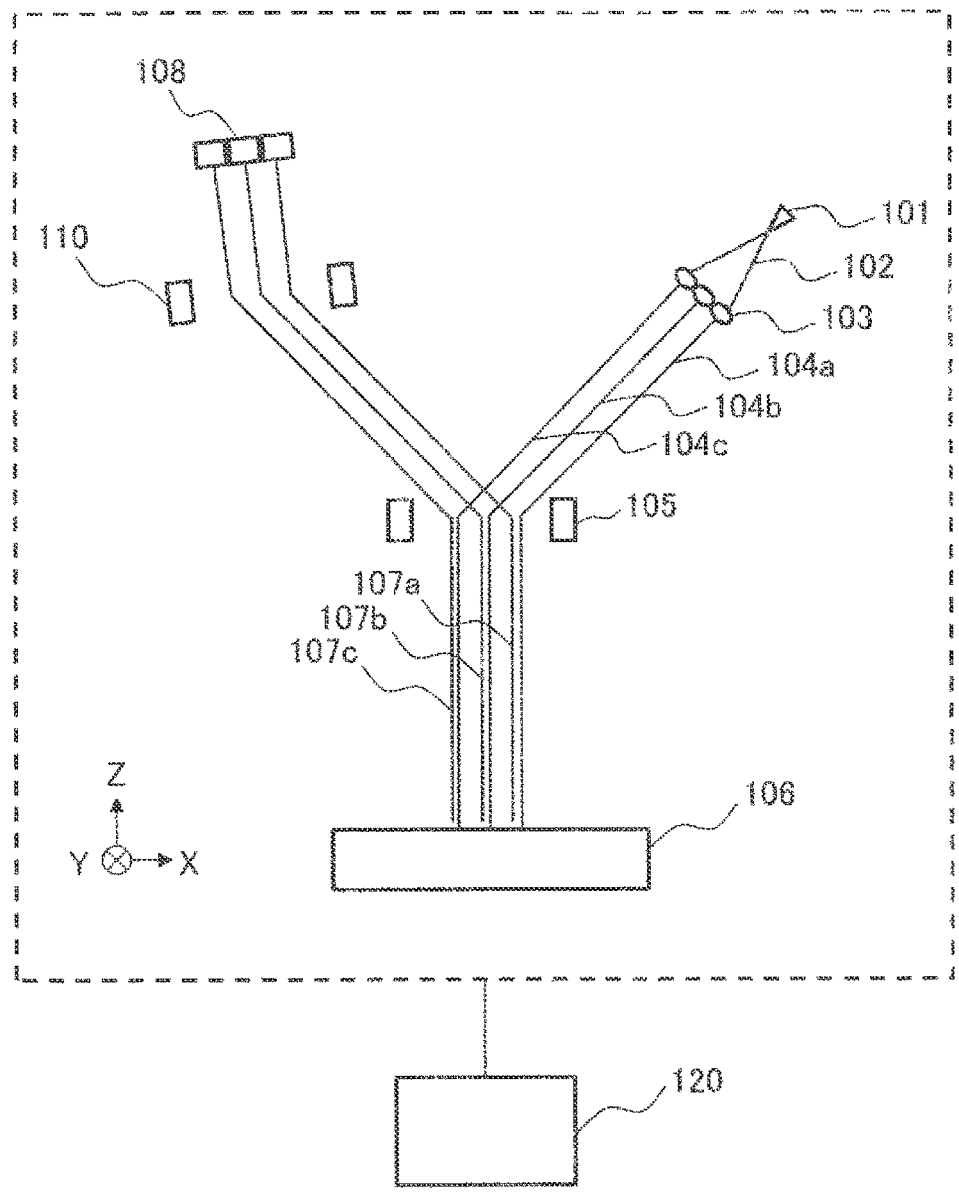

[FIG. 12]
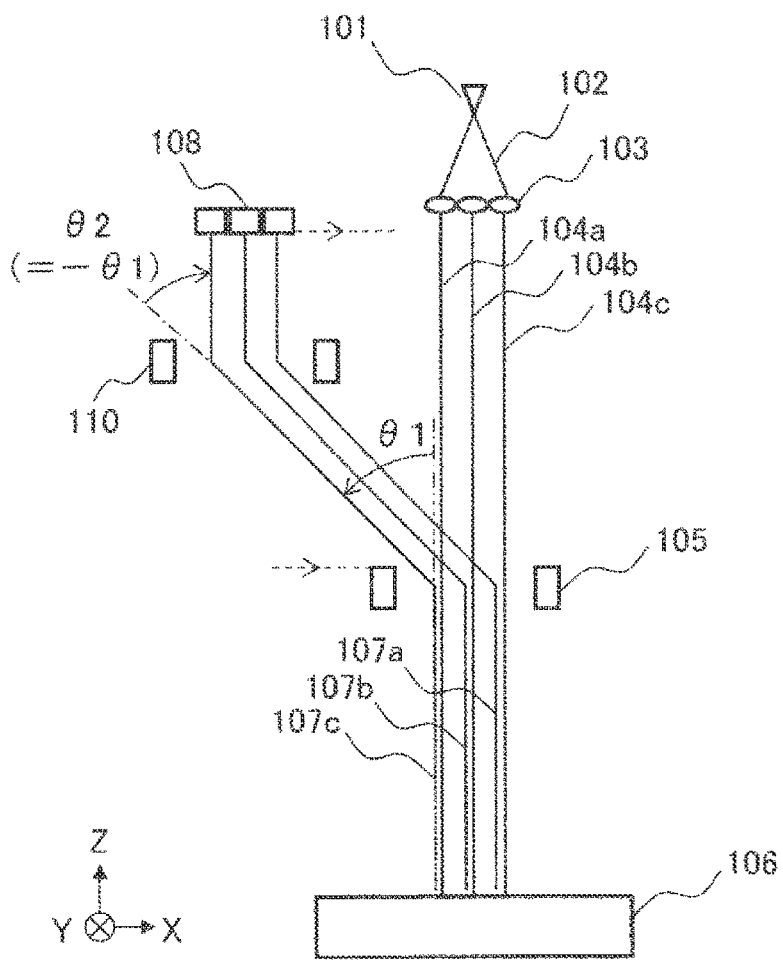

[FIG. 13]
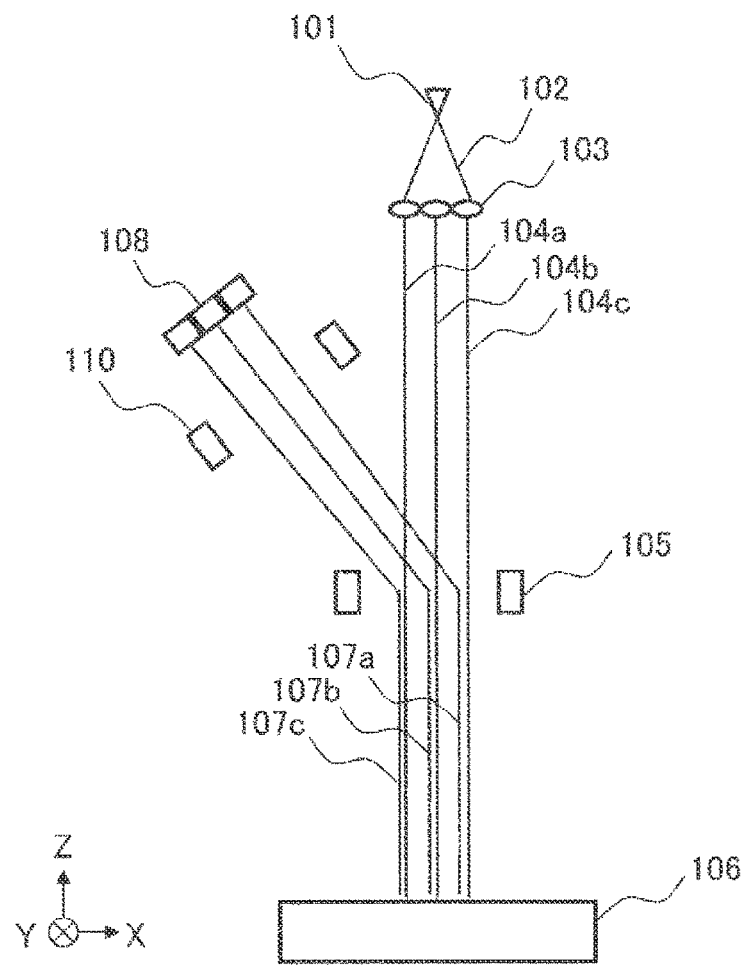

[FIG. 14]
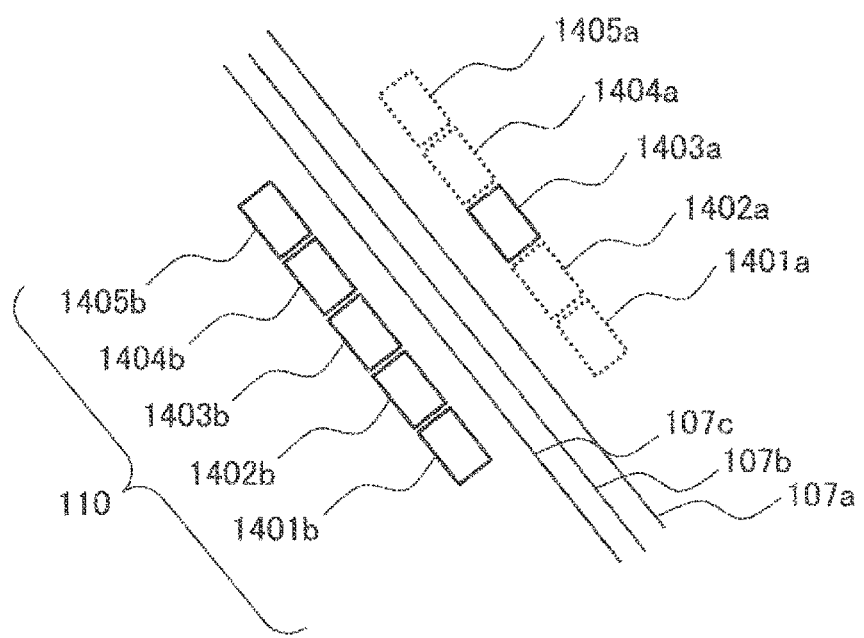

CHARGED PARTICLE BEAM DEVICE

TECHNICAL FIELD

The present invention relates to a charged particle beam device, and particularly to a technique for improving throughput using a plurality of charged particle beams.

BACKGROUND ART

A charged particle beam device is a device that detects secondary charged particles such as secondary electrons or reflected electrons emitted from a sample by irradiating the sample with a charged particle beam such as an electron beam or an ion beam, and that generates an image for observing a fine structure of the sample. The charged particle beam device is used in a manufacturing process of a semiconductor or the like. In the manufacturing process of a semiconductor, improvement of throughput is required, and a multi beam charged particle beam device may be used in which the sample is irradiated with a plurality of charged particle beams and the secondary charged particles emitted from the sample are detected by a plurality of detectors.

In order to separate a primary beam, which is a charged particle beam with which the sample is irradiated, and a secondary beam, which is the secondary charged particles emitted from the sample, the multi beam charged particle beam device is provided with a beam separator that deflects the secondary beam in a direction different from the primary beam. However, in the beam separator, deflection chromatic aberration occurs in the secondary beam.

PTL 1 discloses that a multi beam electron beam device is provided with an electrostatic deflector that corrects deflection chromatic aberration caused by an the electromagnetic deflector which is a beam separator.

CITATION LIST

Patent Literature

PTL 1: WO 2006/101116

SUMMARY OF INVENTION

Technical Problem

However, PTL 1 does not give any consideration to a positional shift between the secondary beams generated in the beam separator. Regarding the secondary beam, a length of a section affected by an electric or magnetic field formed by the beam separator differs depending on positions where the secondary beam is incident on the beam separator, and the longer the affected section in the electric or magnetic field is, the greater the deflection amount is. That is, the positional shift occurs between the secondary beams due to a difference in the positions where the secondary beam is incident on the beam separator, and if the positional shift is too large, the positional shift interferes with the detection of the secondary beam.

Therefore, an object of the invention is to provide a charged particle beam device capable of reducing a positional shift between secondary beams generated in a beam separator.

Solution to Problem

In order to achieve the above-described object, the invention provides a charged particle beam device including a charged particle beam source configured to irradiate a sample with a plurality of primary beams, a plurality of detectors configured to detect secondary beams emitted from the sample in correspondence to the primary beams, and a beam separator configured to deflect the secondary beams in a direction different from that of the primary beams. The charged particle beam device further includes a deflector provided between the beam separator and the detector to correct a positional shift between the secondary beams generated in the beam separator.

Advantageous Effect

According to the invention, it is possible to provide the charged particle beam device capable of reducing the positional shift between the secondary beams generated in the beam separator.

BRIEF DESCRIPTION OF DRAWINGS

FIG. 1 is a schematic diagram showing an example of a charged particle beam device according to a first embodiment.

FIGS. 2A and 2B are diagrams illustrating a beam separator 105 using ExB.

FIG. 3 is a diagram illustrating secondary beams 107 in an electric field E or a magnetic field B formed by the beam separator 105.

FIG. 4 is a diagram showing an example of a positional shift between the secondary beams 107 on a plane 302.

FIG. 6 is a diagram illustrating a deflection angle of the secondary beams 107 in the beam separator 105 and the deflector 110.

FIG. 7 is a diagram illustrating a correction of beam shapes of the secondary beams 107 by the deflector 110.

FIG. 8 is a diagram showing an example of a processing flow for adjusting a ratio of the electric field to the magnetic field of the deflector 110 using the ExB.

FIG. 9 is a diagram showing an example of an adjustment sample 901 used for adjusting the ratio of the electric field to the magnetic field of the deflector 110 using the ExB.

FIG. 10 is a diagram showing an example of an adjustment screen 1001 used for adjusting the ratio of the electric field to the magnetic field of the deflector 110 using the ExB.

FIG. 11 is a schematic diagram showing a modification of the charged particle beam device according to the first embodiment.

FIG. 12 is a schematic diagram showing an example of a charged particle beam device according to a second embodiment.

FIG. 13 is a schematic diagram showing an example of a charged particle beam device according to a third embodiment.

FIG. 14 is a schematic diagram showing an example of the deflector 110 according to the third embodiment.

DESCRIPTION OF EMBODIMENTS

Figure 5A:
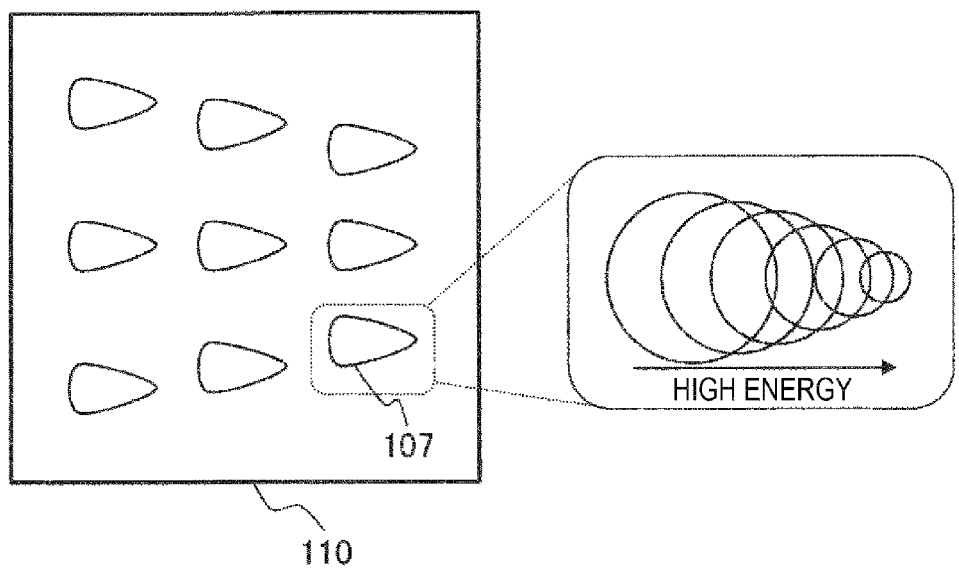
FIGS. 5A and 5B are diagrams illustrating a correction of the positional shift between the secondary beams 107 by a deflector 110.

Hereinafter, embodiments of a charged particle beam device according to the invention will be described with reference to the accompanying drawings. The charged particle beam device is a device that allows a sample to be observed by irradiating the sample with a charged particle beam represented by an electron beam, and may include various devices such as a scanning electron microscope or a scanning transmission electron microscope. Hereinafter, as an example of the charged particle beam device, a multi beam scanning electron microscope that allows the sample to be observed using a plurality of electron beams will be described.

First Embodiment

An overall configuration of the scanning electron microscope according to the present embodiment will be described with reference to FIG. 1. The scanning electron microscope includes an electron source 101, a multi beam forming unit 103, a beam separator 105, a detector 108, a deflector 110, and a control unit 120.

The electron source 101 is a device that generates an electron beam 102 by emitting and accelerating electrons. The electron beam 102 generated by the electron source 101 is separated into a plurality of primary beams 104 by the multi beam forming unit 103. FIG. 1 illustrates, as an example, primary beams 104a, 104b, and 104c which are obtained by separating the electron beam 102 into three. The primary beams 104a, 104b, and 104c are incident on the beam separator 105 and travel toward a sample 106, and the sample 106 are irradiated with the primary beams 104a, 104b, and 104c. The primary beams 104a, 104b, and 104c with which the sample 106 is irradiated are focused and deflected by a focusing lens, an objective lens, and a scanning deflector (not shown).

Secondary electrons, reflected electrons, and the like are emitted as secondary beams 107a, 107b, and 107c from the sample 106 irradiated with the primary beams 104a, 104b, and 104c. The secondary beams 107a, 107b, and 107c are emitted in correspondence to the primary beams 104a, 104b, and 104c, respectively, and are incident on the beam separator 105 and deflected.

An example of the beam separator 105 will be described with reference to FIGS. 2A and 2B. FIGS. 2A and 2B are diagrams of the beam separator 105 as viewed from the side of the electron source 101. FIG. 2A shows the action on the primary beam 104, and FIG. 2B shows the action on the secondary beam 107. The beam separator 105 has a positive electrode 105a, a negative electrode 105b, a positive magnetic pole 105c, and a negative magnetic pole 105d, and forms an electric field E from the positive electrode 105a to the negative electrode 105b and a magnetic field B from the positive magnetic pole 105c to the negative magnetic pole 105d. That is, the electric field E and the magnetic field B orthogonal to each other are formed in a plane orthogonal to the primary beam 104. The electric field E and the magnetic field B are called ExB since the electric field E and the magnetic field B are orthogonal to each other. If the electric field E and the magnetic field B are orthogonal to each other, the number of electrodes and magnetic poles is not limited to two, and may be eight or twelve.

As shown in FIG. 2A, a force 201 generated by the electric field E and a force 202 generated by the magnetic field B act in opposite directions on the primary beams 104, and when the amount of the force 201 is equal to the amount of the force 202, the primary beams 104 travel straight. On the other hand, as shown in FIG. 2B, since the force 201 generated by the electric field E and the force 202 generated by the magnetic field B act on the secondary beams 107 in the same direction, the secondary beams 107 are deflected in a direction different from that of the primary beams 104 due to a combined force of the force 201 and the force 202. That is, the primary beams 104 and the secondary beams 107 are separated by the action of the electric field E and the magnetic field B that are formed by the beam separator 105.

Returning to the illustration in FIG. 1, the secondary beams 107a, 107b, and 107c deflected in the different direction from the primary beams 104a, 104b, and 104c are incident on the detector 108 via the deflector 110 which will be described later. The detector 108 is a device including a plurality of detecting units that detects each of the secondary beams 107a, 107b, and 107c. A detection signal of the detector 108 is transmitted to the control unit 120 and is used to generate an observation image of the sample 106.

The control unit 120 is a device that controls each part of the scanning electron microscope, and is, for example, a general-purpose computer. The computer includes a processor such as a central processing unit (CPU), a storage device such as a memory and a hard disk drive (HDD), an input device such as a keyboard and a mouse, and a display device such as a liquid crystal display. The control unit 120 executes various types of processing by loading a program stored in the HDD into the memory and causing the CPU to execute the program. A part of the control unit 120 may be implemented by hardware such as a dedicated circuit board. The control unit 120 generates and displays the observation image based on the detection signal transmitted from the detector 108.

In order to generate an appropriate observation image, it is desirable that the secondary beams 107 emitted from the sample 106 are completely detected by the detector 108. However, the positional shift between the secondary beams 107 generated in the beam separator 105 may interfere with the detection of the secondary beams 107 executed by the detector 108. Hereinafter, the positional shift between the secondary beams 107 will be described.

The secondary beams 107 in the electric field E or the magnetic field B formed by the beam separator 105 will be described with reference to FIG. 3. Since the electric field E or the magnetic field B formed by the beam separator 105 has a spread in a traveling direction of the secondary beams 107, the length of the section affected by the electric field E or the magnetic field B of the secondary beams 107 differs depending on the positions of the secondary beams 107 incident on the beam separator 105. For example, an affected section 301a of the outer secondary beam 107a among the deflected secondary beams 107 is longer than an affected section 301c of the inner secondary beam 107c. As a result, the outer secondary beam 107a is deflected more than the inner secondary beam 107c.

The positional shift between the secondary beams 107 on the plane 302 in FIG. 3 will be described with reference to FIG. 4. To simplify the description, a sample image plane is selected as the plane 302, which is substantially orthogonal to the deflected secondary beams 107 and in which the secondary beams 107 are most focused. FIG. 4 illustrates, as an example, nine secondary beams 107. Since the amounts to which the secondary beams 107 are deflected differ depending on the length of the affected section 301 of the electric field E or the magnetic field B, due to the difference in the incident position on the beam separator 105, the positional shift occurs between the secondary beams 107 reaching the plane 302. That is, the outer secondary beam 107a is deflected more than the inner secondary beam 107c, so that the beam spacing is widened. If the positional shift between the secondary beams 107 is too large, the secondary beams 107 that cannot be incident on the detector 108 is generated, which interferes with the detection of the secondary beams 107.

The secondary beams 107 have energy dispersion, and the amount of deflection depending on the energy is different. Therefore, the beam shapes are distorted. That is, the secondary beams 107 having high energy are deflected less than the secondary beams 107 having low energy by the electric field E or the magnetic field B, and thus, the beam shapes of the secondary beams 107 are distorted as shown in FIG. 4. The distortion of the beam shapes reduces the detection resolution of the secondary beams 107.

Therefore, in the present embodiment, the deflector 110 provided between the beam separator 105 and the detector 108 corrects the positional shift between the secondary beams 107 generated in the beam separator 105. The deflector 110 is a device that deflects the secondary beams 107 in the direction opposite to that of the beam separator 105, and is, for example, an electric field sector including a positive electrode and a negative electrode, or a magnetic field sector including a positive magnetic pole and a negative magnetic pole. To deflect the secondary beams 107 by the deflector 110 as shown in FIG. 1, an electric field sector is used in which the positive electrode is provided on the right side and the negative electrode is provided on the left side, or a magnetic field sector is used in which the positive magnetic pole is provided in the front and the negative magnetic pole is provided in the back. The ExB forming an electric field and a magnetic field that are orthogonal to each other may be used for the deflector 110.

Figure 5B:
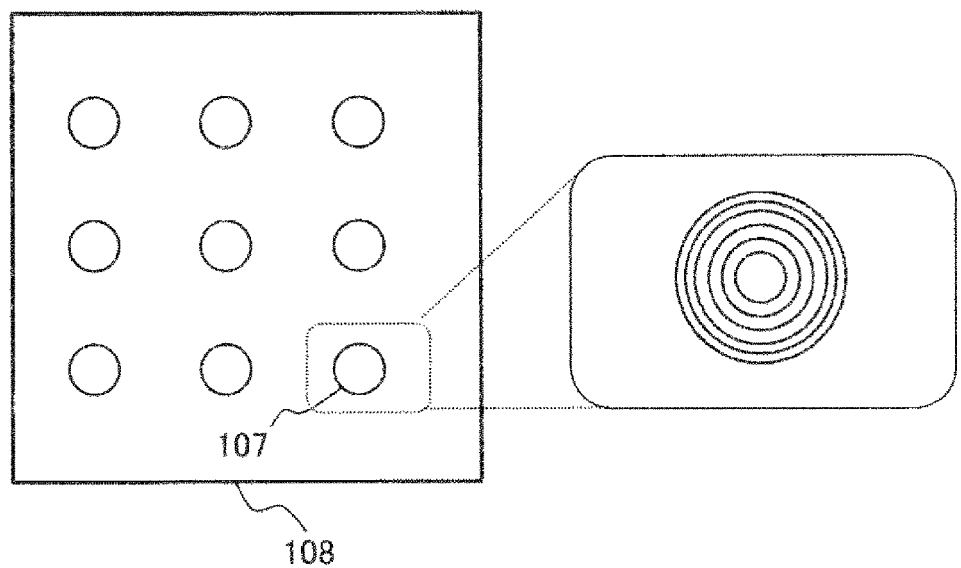

The correction of the positional shift between the secondary beams 107 by the deflector will be described with reference to FIGS. 5A and 5B. FIG. 5A shows the action of deflection by the deflector 110, and FIG. 5B shows the arrangement of the secondary beams 107 corrected by the deflector 110 when the secondary beams 107 are incident on the detector 108. The deflector 110 deflects the secondary beams 107 in the direction opposite to that of the beam separator 105, so that positional shifts in a direction opposite to that in FIG. 4 are generated in the secondary beams 107. As a result, the positional shift generated by the beam separator 105 and the positional shift generated by the deflector 110 cancel each other out, and as shown in FIG. 5B, the secondary beams 107 having the reduced positional shifts can be incident on the detector 108. Regarding the distortion of the beam shapes due to the energy dispersion of the secondary beams 107, since the action of the beam separator 105 and the action of the deflector 110 cancel each other out, the beam shapes are improved.

The deflection angle of the secondary beams 107 in the beam separator 105 and the deflector 110 will be described with reference to FIG. 6. When the angle at which the secondary beam 107b located at the center of the plurality of secondary beams 107 is deflected by the beam separator 105 is θ1, and the angle at which the secondary beam 107b is deflected by the deflector 110 is θ2, θ1 and θ2 are opposite in direction. The incident angle of the secondary beam 107b on the detector 108 is preferably a right angle. Therefore, when the inclination angle of the detector 108 with respect to the beam separator 105 is θ, it is preferable that the deflection angle θ2 obtained by the deflector 110 satisfies the following equation.

$$\theta 2 = \theta - \theta 1 \quad \text{(Equation 1)}$$

The correction of the beam shapes of the secondary beams 107 by the deflector will be described with reference to FIG. 7. FIG. 7 shows orbits of secondary beams 107b-L, 107b-M, and 107b-H, which are the secondary beams 107b having different energy. The secondary beam 107b-L has low energy, the secondary beam 107b-M has medium energy, and the secondary beam 107b-H has high energy.

The deflection angle at the deflector 110 varies depending on the energy of the secondary beam 107b, and becomes smaller as the energy is higher. Therefore, the deflector 110 deflects the secondary beams 107 in the direction opposite to that of the beam separator 105 to reduce the distortion of the beam shapes, and the distortion of the beam shapes disappears particularly at an intersection 701 of the secondary beams 107b-L, 107b-M and 107b-H.

When the deflector 110 is an electric field sector or a magnetic field sector, the magnitude of the electric field or the magnetic field of the deflector 110 is determined according to the deflection angle θ2, and thus, the position of the intersection 701, which is the point where the distortion of the beam shapes disappears, is also uniquely determined. Since the highest detection resolution is obtained by detecting the secondary beams 107 in which the distortion of the beam shapes has disappeared, it is most preferable that the detector 108 is provided at the position of the intersection 701. However, when the detection resolution is equal to or higher than a predetermined value, the detector 108 may be provided at a position where the size of the beam shapes of the detected secondary beams 107 is equal to or less than a predetermined value, that is, in the vicinity of the intersection 701.

When the deflector 110 uses the ExB, the deflection angle θ2 obtained by the deflector 110 can be expressed by the following equation using the deflection angle θ2 (E2) generated by the electric field E2 of the ExB and the deflection angle θ2 (B2) generated by the magnetic field B2 of the ExB.

$$\theta 2 = \theta 2(E2) + \theta 2(B2) \quad \text{(Equation 2)}$$

While a combination of the electric field E2 and the magnetic field B2 in which θ2 becomes a predetermined value is continuously present, the position of the intersection 701 also moves when a ratio of the electric field E2 to the magnetic field B2 changes. That is, by adjusting the ratio of the electric field E2 to the magnetic field B2, the position of the intersection 701 can be moved and the detection resolution of the detector 108 provided at the predetermined position can be controlled.

An example of a processing flow for adjusting the ratio of the electric field E2 to the magnetic field B2 of the deflector 110 using the ExB will be described with reference to FIG. 8.

(S801)

An adjustment sample 901 as illustrated in FIG. 9 as an example is placed in the observation field of view of the scanning electron microscope. The ratio of the electric field E2 to the magnetic field B2 is adjusted based on the difference in the images acquired by the beams. Therefore, as the adjustment sample 901, a sample having a different shape is used for each position irradiated with a plurality of primary beams 104. FIG. 9 illustrates, as an example, the adjustment sample 901 irradiated with nine primary beams 104, and the nine positions have different shapes. When a plurality of secondary beams 107 emitted from different positions of the adjustment sample 901 are incident on the same detection unit in the detector 108, an SEM image in which different shapes are mixed is obtained. That is, based on an evaluation of the SEM image of the adjustment sample 901, a separation degree D of the secondary beams 107 can be calculated using, for example, the following equation.

$$D = Si(i)/Si \quad \text{(Equation 3)}$$

Here, i is a serial number of the plurality of beams, Si is a total signal amount of an i-th SEM image among the SEM images for each beam, and Si (i) is a signal amount of an i-th beam contained in Si. According to (Equation 3), if the SEM image for each beam is the signal amount of the beam, D=1, and if the SEM image for each beam does not include the signal amount of the beam, D=0.

Using a sample, in which the same beam shape is formed at the position irradiated with the plurality of primary beams 104, instead of the adjustment sample 901, it is possible to calculate the separation degree D based on shape deviations in the SEM image for each beam.

(S802)

Using the adjustment screen 1001 illustrated in FIG. 10 as an example, the operator adjusts the ratio of the electric field E2 to the magnetic field B2 of the deflector 110. The adjustment screen 1001 includes a ratio input unit 1002, a capturing start button 1003, an SEM image display unit 1004, a separation degree display unit 1005, and an OK button 1006. To adjust the ratio of the electric field E2 to the magnetic field B2 of the deflector 110, the ratio input unit 1002 is used. That is, the operator inputs the ratio of the electric field E2 to the magnetic field B2 to the ratio input unit 1002. When the deflection angle θ2 obtained by the deflector 110 has been determined (Equation 2), based on the value of either the electric field E2 or the magnetic field B2, the other value can be calculated. Therefore, it is sufficient to input either the value of the electric field E2 or the value of the magnetic field B2.

(S803)

When the operator clicks the capturing start button 1003, the SEM image of the adjustment sample 901 is captured, and the control unit 120 evaluates the SEM image to calculate the separation degree of the secondary beams 107. For example, (Equation 3) is used to calculate the separation degree. The captured SEM image is displayed on the SEM image display unit 1004, and the calculated separation degree is displayed on the separation degree display unit 1005. The lens or aligner may be adjusted in the present step.

(S804)

It is determined whether the separation degree calculated in S803 is within a permissible range. When the determination is executed by the operator, if the separation degree is within the permissible range, the OK button is clicked to end the processing flow in FIG. 8, and if the separation degree is not within the permissible range, the processing returns to S802 and the ratio is readjusted.

By the processing flow described above, the ratio of the electric field E2 to the magnetic field B2 of the deflector 110 is adjusted such that the separation degree of the secondary beams 107 is within the permissible range, and the detection resolution can be thus improved. The control unit 120 may repeat the capturing of SEM images and the calculation of the separation degree while changing the ratio of the electric field E2 to the magnetic field B2, and adjust the ratio such that the separation degree is within the predetermined permissible range.

When the voltage and the current that are supplied to the deflector 110 to form the electric field E2 and the magnetic field B2 are V2 and I2, the deflection angle θ2 can be expressed by the following equation.

$$\theta 2 = aV2\varphi 2 + bI2\varphi 2^{0.5} \quad \text{(Equation 4)}$$

Here, a and b are constants determined by the shape and the configuration, for example, the size or the like of the deflector 110, and φ2 is the energy of the secondary beams 107.

An energy dispersion Disp2 of the secondary beams 107 generated by the deflector 110 can be expressed by the following equation.

$$\text{Disp2} = cV2\varphi 2 + d(I2\varphi 2)^{0.5} \quad \text{(Equation 5)}$$

Here, c and d are constants determined by the shape and the configuration, for example, the size or the like of the deflector 110. To cancel the energy dispersion Disp1 of the secondary beams 107 generated by the beam separator 105 by the deflector 110, the following equation may be satisfied.

$$\text{Disp1} + \text{Disp2} = 0 \quad \text{(Equation 6)}$$

Therefore, when the values of the deflection angle θ2 and the energy dispersion Disp1 is given, the voltage V2 and current I2 that are supplied to the deflector 110 can be calculated based on (Equation 4) to (Equation 6). That is, the voltage V2 and the current I2 are calculated based on the deflection angle θ2 obtained by the deflector 110, the energy dispersion Disp1 generated by the beam separator 105, and the energy φ2 of the secondary beams 107. The electric field E2 and magnetic field B2 of the deflector 110 may be adjusted using the calculated voltage V2 and current I2. Using the calculated voltage V2 and current I2, the adjustment of the electric field E2 and the magnetic field B2 of the deflector 110 can be simplified.

A modification of the scanning electron microscope according to the present embodiment will be described with reference to FIG. 11. In FIG. 1, a scanning electron microscope in which the ExB is used for the beam separator 105 and the primary beams 104 travel straight to irradiate the sample 106 has been described. In FIG. 11, a scanning electron microscope is shown in which an electric field sector or a magnetic field sector is used for the beam separator 105 to deflect the primary beams 104 and irradiate the sample 106. That is, FIG. 11 is different from FIG. 1 only in the beam separator 105, and the other configurations are the same. The deflector 110 deflects the secondary beams 107 in the direction opposite to that of the beam separator 105.

By the above-described scanning electron microscope according to the present embodiment, the positional shift between the secondary beams 107 generated in the beam separator 105 can be reduced. By reducing the positional shift between the secondary beams 107, the secondary beams 107 can be incident on the detection units of the detector 108, and thus the detection of the secondary beams 107 is not interfered. Since the distortion of the beam shapes of the secondary beams 107 is also reduced, the detection resolution is improved.

Second Embodiment

In the first embodiment, a case has been described in which the inclination angle θ of the detector 108 with respect to the beam separator 105 is any angle. In the present embodiment, a case will be described in which the beam separator 105 and the detector 108 are parallel. The same reference numerals are given to the components having the same functions as in the first embodiment, and the description thereof will be omitted.

An overall configuration of the scanning electron microscope according to the present embodiment will be described with reference to FIG. 12. In the present embodiment, the beam separator 105 and the detector 108 are arranged in parallel. That is, the inclination angle θ of the detector 108 with respect to the beam separator 105 is zero, and the detector 108 is provided perpendicular to the direction of gravity. Also in FIG. 12, by deflecting the secondary beams 107 in the direction opposite to that of the beam separator 105 by the deflector 110, the positional shift between the secondary beams 107 generated in the beam separator 105 is corrected. When θ=0 is substituted into (Equation 1), θ2=−θ1. Therefore, it is preferable that the deflection angle θ1 of the beam separator 105 and the deflection angle θ2 of the deflector 110 are equal absolute values.

By the above-described scanning electron microscope according to the present embodiment, as in the first embodiment, the positional shift between the secondary beams 107 generated in the beam separator 105 can be reduced. Since the distortion of the beam shapes of the secondary beams 107 is also reduced, the detection resolution is improved. Moreover, since the detector 108 is provided perpendicular to the direction of gravity, even when the detector 108 vibrates in the direction of gravity, the secondary beams 107 do not shift with respect to the detector 108, and the SEM images can be stably generated.

Third Embodiment

In the first embodiment, a case has been described in which the secondary beams 107 are deflected in the direction opposite to that of the beam separator 105 by the deflector 110. In the present embodiment, a case will be described in which the ExB is used for the deflector 110 and the secondary beams 107 travel straight. The same reference numerals are given to the components having the same functions as in the first embodiment, and the description thereof will be omitted.

An overall configuration of the scanning electron microscope according to the present embodiment will be described with reference to FIG. 13. In the present embodiment, the ExB is used for the deflector 110 and the secondary beams 107 travel straight through the deflector 110. That is, the deflection angle θ2 obtained by the deflector 110 is zero, and the beam separator 105, the deflector 110, and the detector 108 are arranged in a straight line. In FIG. 13, while θ2=0 is maintained, by adjusting the ratio of the electric field E2 to the magnetic field B2 in the deflector 110, the size of the beam shapes of the secondary beams 107 in the detector 108 is controlled to adjust the detection resolution of the detector 108. The ratio of the electric field E2 to the magnetic field B2 is adjusted according to the processing flow shown in FIG. 8.

When the deflection angle θ2=0, it is somewhat difficult to correct the positional shift between the secondary beams 107. Therefore, in the present embodiment, a deflector 110 that forms an electromagnetic field asymmetric with respect to the secondary beams 107 as shown in FIG. 14 may be used. The deflector 110 shown in FIG. 14 has a plurality of electrodes or magnetic poles 1401 to 1405 arranged along the secondary beams 107.

The electrodes or magnetic poles 1401 to 1405 are partially turned on on a side where the spread of the electric field or magnetic field formed by the deflector 110 is controlled, and all the electrodes or magnetic poles are turned on on the other side. FIG. 14 illustrates, as an example, a case in which electrodes or magnetic poles 1403a and 1401b to 1405b are turned on and electrodes or magnetic poles 1401a, 1402a, 1404a, and 1405a are turned off. By operating the electrodes or magnetic poles 1401 to 1405 in this way, the electromagnetic field asymmetric with respect to the secondary beams 107 is formed, and in FIG. 14, the affected section from the asymmetric electromagnetic field becomes longer in the secondary beam 107c and shorter in the secondary beam 107a. By adjusting the affected section from the asymmetric electromagnetic field, the positional shift between the secondary beams 107 is corrected.

By the above-described scanning electron microscope according to the present embodiment, with the formation of the asymmetric electromagnetic field, the positional shift between the secondary beams 107 generated in the beam separator 105 can be reduced. Since the distortion of the beam shapes of the secondary beams 107 is also reduced, the detection resolution is improved. Moreover, the secondary beams 107 travel straight through the deflector 110. Therefore, the beam separator 105, the deflector 110, and the detector 108 are arranged in a straight line, which makes the manufacture of the scanning electron microscope easier.

As described above, a plurality of embodiments of the charged particle beam device according to the invention has been described. The invention is not limited to the above embodiments, and constituent elements may be modified and embodied without departing from the spirit of the invention. A plurality of constituent elements disclosed in the above embodiments may be appropriately combined. Further, some constituent elements may be deleted from all the constituent elements shown in the above embodiments.

REFERENCE SIGN LIST

101 . . . electron source, 102 . . . electron beam, 103 . . . multi beam forming unit, 104 . . . primary beam, 105 . . . beam separator, 105a . . . positive electrode, 105b negative electrode, 105c . . . positive magnetic pole, 105d . . . negative magnetic pole, 106 . . . sample, 107 . . . secondary beam, 108 . . . detector, 110 . . . deflector, 120 . . . control unit, 201 force generated by electric field E, 202 . . . force generated by magnetic field B, 301 . . . affected section, 302 . . . plane, 701 intersection, 901 . . . adjustment sample, 1001 . . . adjustment screen, 1002 . . . ratio input unit, 1003 . . . capturing start button, 1004 . . . . SEM image display unit, 1005 . . . separation degree display unit, 1006 . . . . OK button, 1401 to 1405 . . . a plurality of electrodes or magnetic poles

The invention claimed is:

1. A charged particle beam device including a charged particle beam source configured to irradiate a sample with a plurality of primary beams, a plurality of detectors configured to detect secondary beams emitted from the sample in correspondence to the primary beams, and a beam separator configured to deflect the secondary beams in a direction different from that of the primary beams, the charged particle beam device further comprising
a deflector provided between the beam separator and the detector to correct a positional shift between the secondary beams generated in the beam separator.

2. The charged particle beam device according to claim 1, wherein
the deflector corrects a distortion of beam shapes of the secondary beams generated in the beam separator together with the positional shift.

3. The charged particle beam device according to claim 2, wherein
the beam separator forms a first electric field and a first magnetic field that are orthogonal to each other in a plane orthogonal to the primary beams, and causes the primary beams to travel straight to deflect the secondary beams, the deflector forms a second electric field and a second magnetic field that are orthogonal to each other, and magnitude of the second electric field and magnitude of the second magnetic c field are adjusted based on observation images different for each position irradiated with the primary beams.

4. The charged particle beam device according to claim 2, wherein the beam separator forms a first electric field and a first magnetic field that are orthogonal to each other in a plane orthogonal to the primary beams, and causes the primary beams to travel straight to deflect the secondary beams, and the deflector is supplied with a voltage and a current for forming a second electric field and a second magnetic field that are orthogonal to each other, values of the voltage and the current are set based on an angle at which the secondary beams are deflected by the deflector, energy dispersion of the secondary beams generated by the beam separator, and energy of the secondary beams.

5. The charged particle beam device according to claim 2, wherein the detector is provided at a position where a size of the beam shapes of the secondary beams is equal to or less than a predetermined value.

6. The charged particle beam device according to claim 1, wherein the deflector deflects the secondary beams in a direction opposite to that of the beam separator.

7. The charged particle beam device according to claim 1, wherein an angle at which the secondary beams are deflected by the deflector is set based on an inclination angle of the detector with respect to the beam separator.

8. The charged particle beam device according to claim 7, wherein the detector and the beam separator are parallel, and an angle $\theta 1$ at which the secondary beams are deflected by the beam separator and an angle $\theta 2$ at which the secondary beams are deflected by the deflector have relation of $\theta 2 = -\theta 1$.

9. The charged particle beam device according to claim 7, wherein when an angle $\theta 1$ at which the secondary beams are deflected by the beam separator is equal to an inclination angle $\theta$ of the detector with respect to the beam separator, the deflector forms an electric field and a magnetic field that are orthogonal to each other in a plane orthogonal to the secondary beams, causes the secondary beams to travel straight, and corrects chromatic aberration of the secondary beams.

10. The charged particle beam device according to claim 9, wherein the deflector has a plurality of electrodes and a plurality of magnetic poles arranged along the secondary beams, and forms an electromagnetic field asymmetric with respect to the secondary beams.

* * * * *